Figure 1:
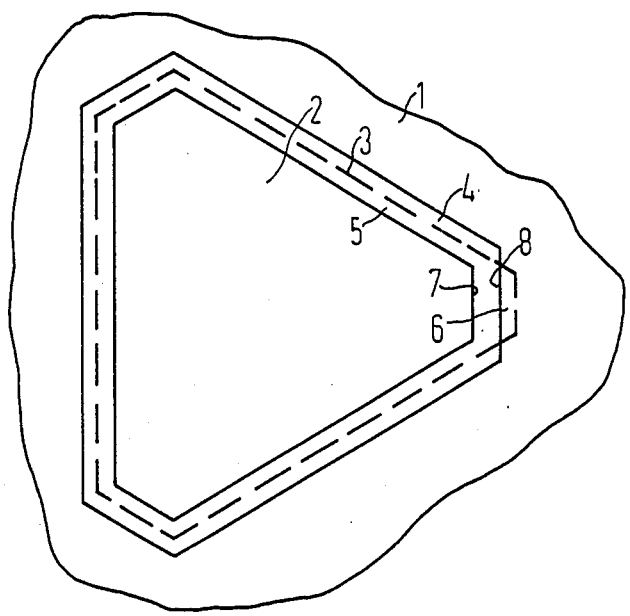

United States Patent [19]

Voss

[11] Patent Number: 4,803,538

[45] Date of Patent: Feb. 7, 1988

[54] THYRISTOR WITH ADJUSTABLE BASE-TO-EMITTER RESISTANCE

[75] Inventor: Peter Voss, Munich, Fed. Rep. of Germany

[73] Assignee: Siemens Aktiengesellschaft, Berlin and Munich, Fed. Rep. of Germany

[21] Appl. No.: 21,473

[22] Filed: Mar. 4, 1987

[30] Foreign Application Priority Data

Mar. 5, 1986 [DE] Fed. Rep. of Germany ....... 3607256

[51] Int. Cl.[4] .................................. H01C 29/74
[52] U.S. Cl. ..................... 357/38; 357/20; 357/68; 357/86; 357/51
[58] Field of Search ............ 357/20, 38, 86, 68, 357/51

[56] References Cited

U.S. PATENT DOCUMENTS 4,016,592  4/1977  Yatsuo et al. ................ 357/38
4,053,922  10/1977  Ferro ............................ 357/86

Primary Examiner—Joseph E. Clawson, Jr.
Attorney, Agent, or Firm—Herbert L. Lerner; Laurence A. Greenberg

[57] ABSTRACT

A thyristor having a semiconductor body with an emitter zone and a base zone formed thereon, an emitter electrode seated on the emitter zone, and a base electrode seated on the base zone, the emitter electrode being formed with a recess, includes a base emitter p-n junction disposed within the recess and adjoining a surface of the semiconductor body, a gate electrode seated on the base zone and an ohmic resistance integrated in the semiconductor body between the emitter electrode and the gate electrode, the p-n junction being locally bridged by one of the gate and emitter electrodes, the ohmic resistance having a value adjustable in accordance with a removal of a part of at least one of the gate and emitter electrodes.

3 Claims, 2 Drawing Sheets

A thyristor having a semiconductor body with the following characteristics:

THYRISTOR WITH ADJUSTABLE BASE-TO-EMITTER RESISTANCE

The invention relates to a thyristor having a semiconductor body with the following characteristics:
(a) The emitter electrode is formed with a recess,
(b) the base-to-emitter p-n junction on the cathode side adjoins the surface of the semiconductor body on the cathode side within the recess,
(c) a gate electrode is seated on the base zone,
(d) an ohmic resistance integrated into the semiconductor body is provided between the emitter electrode and the base electrode.

Such thyristors are in the state of the art and have been described, for example, in German Pat. No. 11 56 510. The emitter zone of this thyristor is formed with a multiplicity of recesses by means of which the base zone underlying it is electrically connected with the emitter electrode. The reason for this measure is to improve the temperature stability and the dv/dt strength of the thyristor.

To be triggered, thyristors of one and the same type usually require gate trigger currents of differing intensity because of unavoidable variations in construction. These gate trigger currents should not exceed a given scattering range.

It is accordingly an object of the invention to provide a thyristor which is improved over the foregoing in such a way that the gate trigger current can be set to a value within the scattering band after manufacture of the thyristor.

With the foregoing and other objects in view, there is provided, in accordance with the invention, a thyristor having a semiconductor body with an emitter zone and a base zone formed thereon, an emitter electrode seated on the emitter zone, and a base electrode seated on the base zone, the emitter electrode being formed with a recess, comprising a cathode-side base-emitter p-n junction disposed within the recess and adjoining a surface on the cathode side of the semiconductor body, a gate electrode seated on the base zone and an ohmic resistance integrated in the semiconductor body between the emitter electrode and the gate electrode, the p-n junction being locally bridged by one of the gate and emitter electrodes, the ohmic resistance having a value adjustable in accordance with a removal of a part of at least one of the gate and emitter electrodes.

With this construction, an adjustable shunt of the path, namely gate electrode-to-p-n junction-to-emitter zone, is created through which a more or less greater part of the trigger current, depending on its strength, can flow directly to the emitter electrode, by bypassing the p-n junction.

In accordance with another feature of the invention, the p-n junction is locally bridged by the emitter electrode, and the ohmic resistance is formed by the base zone.

In accordance with an added feature of the invention, the base zone has a finger projecting into the emitter zone, and including a metal bridge connected to the emitter electrode and contacted by the finger.

In accordance with an additional feature of the invention, the gate electrode is formed with a recess at the periphery thereof, the metal bridge projecting into the last-mentioned recess.

In accordance with a further feature of the invention, a strip-shaped zone having a conductivity type opposite that of the base zone is embedded in the base zone, the emitter electrode locally bridges the p-n junction and contacts the strip-shaped zone, the gate electrode also contacts the strip-shaped zone, and the ohmic resistance is formed by the strip-shaped zone.

In accordance with again another feature of the invention, the gate electrode is formed with a recess at the periphery thereof, the strip-shaped zone projecting into the last-mentioned recess and extending to a location underlying the gate electrode.

In accordance with again an additional feature of the invention, the strip-shaped zone has a meandering or sinuous contruction.

In accordance with a concomitant feature of the invention, the recess, the p-n junction adjoining the surface of the semiconductor body and the gate electrode are formed as polygons, and the ohmic resistance is arranged at least at one corner of the polygons.

Other features which are considered as characteristic for the invention are set forth in the appended claims.

Although the invention is illustrated and described herein as embodied in a thyristor with adjustable base-to-emitter resistance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1 to 4 are top plan views of four different exemplary embodiments of a thyristor according to the invention, in which identical parts or those having the same function are identified by the same reference numerals.

Referring now to the drawing and first, particularly, to FIG. 1 thereof, there is shown a thyristor with a semiconductor body having an emitter electrode 1 formed with a recess within which a p-n junction 3, located between an emitter zone 4 and a base zone 5, extends to the surface of the semiconductor body. The base zone 5 is in contact with a gate electrode 2. The p-n junction 3 is locally bridged by the emitter electrode 1 which, with its region 6, contacts the base zone 5.

The gate electrode 2, the p-n junction 3 and the recess of the emitter electrode 1 are of polygonal construction. The region 6 of the emitter electrode is defined by an edge 8. An edge 7 of the gate electrode 2 lies opposite and parallel to the edge 8. Ohmic resistance or resistivity is adjusted by varying the mutual spacing of the edges 7 and 8. For this purpose, the thyristor is initially manufactured with a minimal base-to-emitter resistance. Then, the gate trigger current of the thyristor is checked to determine if it is within the permissible trigger scattering bad. If this is not the case, the resistance is increased by increasing the spacing between the edges 7 and 8 until a desired value has been reached. In an extreme case, the edge 8 can also be set back in the direction of the emitter zone 4 so far that the emitter electrode 1 no longer is in contact with the base zone 5. The emitter-to-base resistance is thereby interrupted and disabled.

Figure 2:
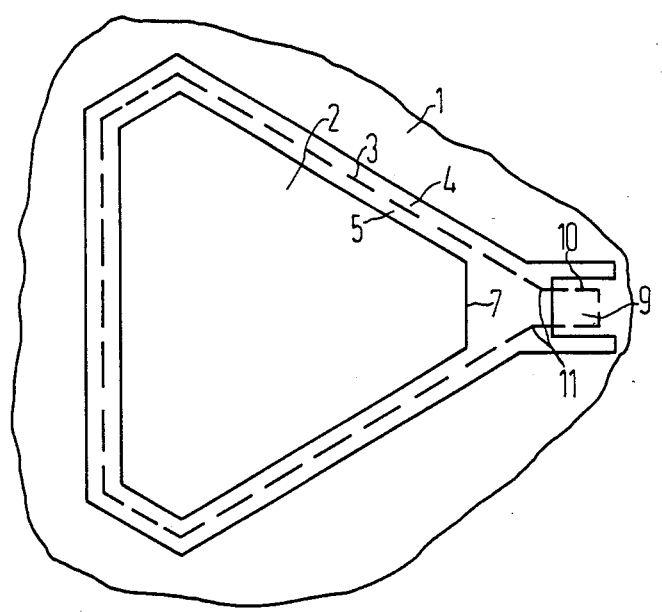

The exemplary embodiment according to FIG. 2 differs from that of FIG. 1 in that the base zone 5 has a finger 9 which projects into the emitter zone 4. The emitter electrode 1 has a metal bridge 10 which is in contact with the finger 9. The base-to-emitter resistance is adjusted by the distance or spacing of the metal bridge 10 from the edge 7 of the gate electrode 2. The resistance is then formed by a part of the base zone 5. In the exemplary embodiment of FIG. 2, the p-n junction 3 has corners 11 at the transition thereof into the finger 9, the corners 11 having an angle <180° with respect to the emitter zone 4, at which triggering could preferably occur in the case wherein the metal bridge 10 does not cover these corners 11. Therefore, the distance or spacing between the corners 11 and the gate electrode 2 must, in all cases, be greater than the distance or spacing between the gate electrode 2 and the p-n junction 3 in the remaining region of the thyristor.

Figure 3:
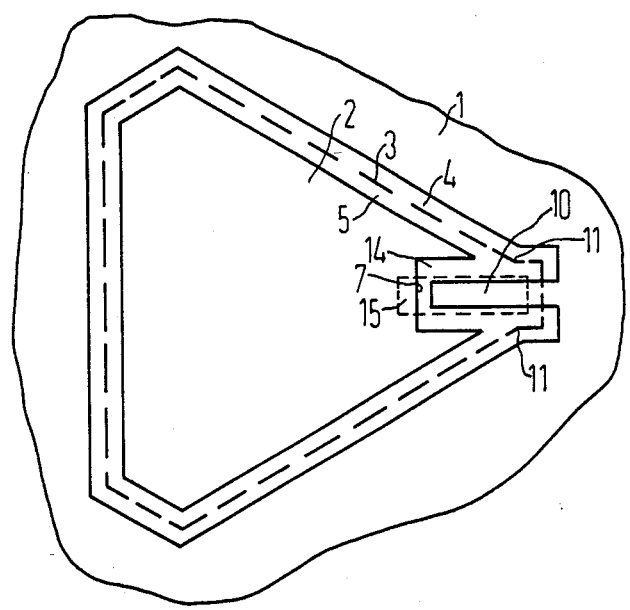

In the exemplary embodiment of FIG. 3, a zone 15 of opposite conductivity to that of the base zone 5 has been embedded in the base zone 5. This zone 15 is in contact with the metal bridge 10 of the emitter electrode 1 on one side thereof, and projects on the other side thereof, into a recess 14 formed in the gate electrode 2 and to a location underneath the gate electrode 2. The resistance is formed by a part of the zone 15.

The value of the resistance is generally determined by the distance or spacing between the metal bridge 10 and the straight edge 7 of the gate electrode 2. The same description presented hereinabove in connection with FIG. 2 is true for the distance or spacing of the corners 11 of the p-n junction 3 from the gate electrode 2 in FIG. 3. The zone 15 may, for example, have a length of 2 mm, a width of 100 82 m and a resistance of 0.5 $\Omega/\square$.

Figure 4:
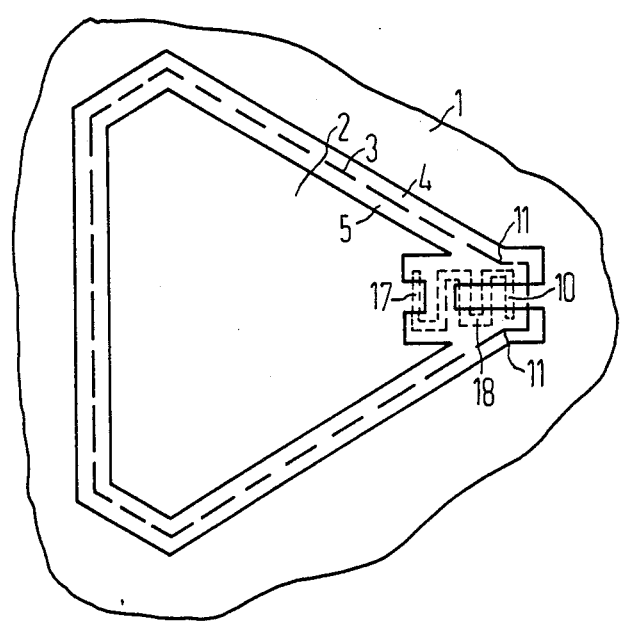

A modification in the exemplary embodiment of FIG. 3 is shown in FIG. 4. The zone of opposite conductivity embedded into the base zone has been given a meandering shape in FIG. 4 and is identified by reference numeral 18. The gate electrode 2 is formed with a tongue 17 for contacting the zone 18 at the side of the gate electrode 2. The base-emitter resistance, in the embodiment of FIG. 4, may be adjusted stepwise by varying the length of the bridge 10 and/or the tongue 17 that different transverse lengths of the meandering zone 18 are contacted.

As long as the connection between the tongue 17 and the meandering zone 18 does not have to be broken, the zone 18 can also be connected to the emitter 4. If the connection between the tongue 17 and the zone 18 should be broken, however, the expectation arises that points at which triggering is most likely to occur would form at the corners of the meandering zone 18 located opposite the gate electrode 2.

The aforedescribed exemplary embodiments have polygonal configurations. However, it is also possible to form the gate electrode 2, the p-n junction 3 and the recess in the emitter electrode 1 in a generally circular fashion. The adjustable resistance is then correspondingly formed by a recess, metal bridges or fingers.

With generally circular arrangements, however, there arises the danger that, with a complete disruption of the shunt for the trigger current, a current path will be created leading to the locations at which triggering is most likely to occur.

The exemplary embodiments relate to a single base-to-emitter shunt. It is also possible, however, to provide several, preferably symmetrically arranged resistances.

The foregoing is a description corresponding in substance to German Application No. P 36 07 265.6, dated Mar. 5, 1986, the International priority of which is being claimed for the instant application, and which is hereby made part of this application. Any material discrepancies between the foregoing specification and the aforementioned corresponding German application are to be resolved in favor of the latter.

I claim:

1. Thyristor having a semiconductor body with an emitter zone and a base zone formed thereon, an emitter electrode seated on the emitter zone, and a base electrode seated on the base zone, the emitter electrode being formed with a recess, comprising a base-emitter p-n junction disposed within the recess and adjoining a surface of the semiconductor body, a gate electrode seated on the base zone, an ohmic resistance integrated in the semiconductor body between the emitter electrode and said gate electrode, said p-n junction being locally bridged by one of said gate and emitter electrodes, said ohmic resistance having a value adjustable in accordance with a removal of a part of at least one of said gate and emitter electrodes, said p-n junction being locally bridged by the emitter electrode, and said ohmic resistance being formed by the base zone, the base zone having a finger projecting into the emitter zone, and a metal bridge connected to the emitter electrode and contacted by said finger, said gate electrode being formed with a recess at the periphery thereof, said metal bridge projecting into said last-mentioned recess.

2. Thrysistor having a semiconductor body with an emitter zone and a base zone formed thereon, an emitter electrode seated on the emitter zone, and a base electrode seated on the base zone, the emitter electrode being formed with a recess, comprising a base-emitter p-n junction disposed within the recess and adjoining a surface of the semiconductor body, a gate electrode seated on the base zone, an ohmic resistance integrated in the semiconductor body between the emitter electrode and said gate electrode, said p-n junction being locally bridged by one of said gate and emitter electrodes, said ohmic resistance having a value adjustable in accordance with a removal of a part of at least one of said gate and emitter electrodes, a strip-shaped zone having a conductivity type opposite that of the base zone being embedded in the base zone, the emitter electrode locally bridging said p-n junction and contacting said strip-shaped zone, said gate electrode also contacting said strip-shaped zone, and said ohmic resistance being formed by said strip-shaped zone, said gate electrode being formed with a recess at the periphery thereof, and said strip-shaped zone projecting into said last-mentioned recess and extending to a location underlying said gate electrode.

3. Thyristor having a semiconductor body with an emitter zone and a base zone formed thereon, an emitter electrode seated on the emitter zone, and a base electrode seated on the base zone, the emitter electrode being formed with a recess, comprising a base-emitter p-n junction disposed within the recess and adjoining a surface of the semiconductor body, a gate electrode seated on the base zone, an ohmic resistance integrated in the semiconductor body between the emitter electrode and said gate electrode, said p-n junction being locally bridged by one of said gate and emitter electrodes, said ohmic resistance having a value adjustable in accordance with a removal of a part of at least one of said gate and emitter electrodes, a strip-shaped zone having a conductivity type opposite that of the base zone being embedded in the base zone, the emitter electrode locally bridging said p-n junction and contacting said strip-shaped zone, said gate electrode also contacting said strip-shaped zone, and said ohmic resistance being formed by said strip-shaped zone, said strip-shaped zone having a meandering or sinuous construction.

* * * * *

UNITED STATES PATENT AND TRADEMARK OFFICE
CERTIFICATE OF CORRECTION

PATENT NO. : 4,803,538
DATED      : Feb. 7, 1989
INVENTOR(S) : Peter Voss

It is certified that error appears in the above-identified patent and that said Letters Patent is hereby corrected as shown below:

In the title page, item (45), line 1,

"Feb. 7, 1988" should read --Feb. 7, 1989--.

Signed and Sealed this

Fourteenth Day of November, 1989

Attest:

JEFFREY M. SAMUELS

Attesting Officer     Acting Commissioner of Patents and Trademarks